United States Patent
Bae

(10) Patent No.: US 8,385,110 B2
(45) Date of Patent: Feb. 26, 2013

(54) SEMICONDUCTOR MEMORY DEVICE WITH SECURITY FUNCTION AND CONTROL METHOD THEREOF

(75) Inventor: Ji Hyae Bae, Incheon (KR)

(73) Assignee: Hynix Semiconductor Inc., Icheon (KR)

( * ) Notice: Subject to any disclaimer, the term of this patent is extended or adjusted under 35 U.S.C. 154(b) by 307 days.

(21) Appl. No.: 12/827,780

(22) Filed: Jun. 30, 2010

(65) Prior Publication Data

US 2011/0182101 A1    Jul. 28, 2011

(30) Foreign Application Priority Data

Jan. 28, 2010    (KR) .................. 10-2010-0007861

(51) Int. Cl.
*G11C 11/00*    (2006.01)
(52) U.S. Cl. ............... 365/163; 365/148; 365/189.12; 365/189.17
(58) Field of Classification Search .......... 365/163, 365/148, 189.12, 189.17, 185.21–185.22; 711/163, 103, 109, E12.091
See application file for complete search history.

(56) References Cited

U.S. PATENT DOCUMENTS

| 7,031,188 | B2 * | 4/2006 | Lee et al. ................. 365/185.04 |
| 7,046,569 | B2   | 5/2006 | Ito et al. |
| 7,457,152 | B2 * | 11/2008 | Lee et al. ..................... 365/163 |
| 7,952,956 | B2 * | 5/2011 | Wang et al. .............. 365/230.09 |

FOREIGN PATENT DOCUMENTS

| KR | 1020050113659 A | 2/2005 |
| KR | 1020050098797 A | 10/2005 |
| KR | 1020080112601 A | 12/2007 |

* cited by examiner

*Primary Examiner* — David Lam

(57) ABSTRACT

A semiconductor memory device includes a security controller. When a one time programmable (OTP) device is programmed, the semiconductor memory device prohibits lock-status information pre-stored in an OTP lock register from being changed to an unlock status, such that it increases the stability of data stored in an OTP area. The semiconductor memory device includes an OTP device configured to determine whether or not data is changed according to a lock/unlock status when a program command is received, and an OTP controller configured to prohibit the lock status from being changed to the unlock status.

20 Claims, 5 Drawing Sheets

SEMICONDUCTOR MEMORY DEVICE WITH SECURITY FUNCTION AND CONTROL METHOD THEREOF

CROSS-REFERENCE TO RELATED APPLICATION

The priority of Korean patent application No. 10-2010-0007861 filed on Jan. 28, 2010, the disclosure of which is hereby incorporated in its entirety by reference, is claimed.

BACKGROUND OF THE INVENTION

Embodiments of the present invention relate to a semiconductor memory device including a security function.

A semiconductor memory device has been rapidly developed to temporarily or permanently store data therein. The semiconductor memory device has been widely used in a variety of electronic appliances, electronic devices, and personal portable devices. General semiconductor memory devices can freely read and/or write data, and can also easily replace old data with new data. However, regarding important information, the forgery or modification of this information needs to be prevented. When important data is recorded in a semiconductor memory device, an improved function for preventing the forgery or modification of such important information needs to be developed.

In compliance with the demand of developing the improved function, a one time programmable (OTP) function (hereinafter referred to as an OTP device) is added to the semiconductor memory device. The OTP device is needed for implementing the security. Some semiconductor memory devices use lock-status unit cells to prevent important or significant data from overlapping, such that it is impossible to implement a write or program function on the lock-status unit cells.

For example, some of the non-volatile semiconductor memory devices provide some parts of a unit-cell array as an OTP array. A cell array including a controller for preventing a lock-status unit cell from being returned to an unlock status is called an OTP array. The OTP array stores important data including security data such as a serial number, manufacturer's information, date when the semiconductor memory device was manufactured and the like. Therefore, the data once-programmed in the OTP array needs to be safely protected from external manipulation, and not be modified or changed by a subsequent programming operation.

BRIEF SUMMARY OF THE INVENTION

Various embodiments of the present invention are directed to providing a semiconductor memory device including a security controller that substantially obviates one or more problems due to limitations and disadvantages of the related art.

Embodiments of the present invention relate to a semiconductor memory device including an one time programmable (OTP) device controller, which prevents lock-status information pre-stored in an OTP lock register from being changed to an unlock status when an OTP device is programmed, thereby preventing the lock-status OTP device from being programmed and increasing the stability of data stored in an OTP area.

In accordance with one embodiment of the present invention, there is provided a semiconductor memory device including an one time programmable (OTP) device configured to determine whether or not data is changed according to a lock/unlock status when a program command is received; and an OTP controller configured to prohibit the lock status from being changed to the unlock status.

The OTP device may include an OTP register configured to store the data; and an OTP lock register configured to store information of the lock/unlock status of the OTP register.

The OTP device may designate some parts of a cell array including a plurality of unit cells, and thus the designated parts are used as the OTP register and the OTP lock register.

The semiconductor memory device may further include a write driver configured to write or program data in the cell array including the OTP register and the OTP lock register.

The OTP controller may include an address comparator configured to compare an external input address with an address of the OTP lock register, and output the result of comparison; a program pulse generator configured to output a reset pulse and a set pulse in response to the comparison result signal of the address comparator; and a read signal generator configured to output a read control signal in response to the comparison result signal of the address comparator.

The program pulse generator may deactivate the reset pulse when the external input address and the address of the OTP lock register are identical to each other.

The program pulse generator may include a reset pulse generator configured to generate the reset pulse; a logic gate configured to enable the reset pulse generator, when the program command is received and the external input address is not identical to the address of the OTP lock register; and a set pulse generator configured to be enabled by the program command, and generate the set pulse.

The read signal generator may deactivate a read control signal when the external input address is identical to the address of the OTP lock register.

The read signal generator may include a read signal generator configured to generate the read control signal; and a logic gate configured to enable the read signal generator, when a read command is received and the external input address is not identical to the address of the OTP lock register.

The lock status may mean a specific operation for prohibiting the data stored in the OTP device from being permanently changed, and the OTP device is comprised of one or more non-active unit cells.

In accordance with another embodiment of the present invention, there is provided a method for controlling a semiconductor memory device including determining whether or not data is changed according to a lock/unlock status when a program command is received; and prohibiting, before determining whether or not the data is changed, the lock status from being selectively changed to the unlock status when a program command is received.

The prohibiting the lock status from being selectively changed to the unlock status may include comparing an external input address with an address of an one time programmable (OTP) lock register when the program command is received; and selectively indicating a change to the unlock status according to the result of comparison.

The method may further include indicating a change of the unlock status when the external input address does not correspond to the address of the OTP lock register.

The determining whether or not data is changed according to the lock/unlock status when the program command is received may include confirming, by an OTP lock register, information of lock/unlock statuses of a one time programmable (OTP) register corresponding to an external input address.

In accordance with another embodiment of the present invention, there is provided a phase-change memory device including a register configured to include a plurality of phase-change memory cells; a lock register configured to store information of lock/unlock statuses of the plurality of phase-change memory cells; a write driver configured to generate a program current for programming the plurality of phase-change memory cells; and a controller configured to control the write driver in order not to prohibit the program current from being provided to one or more lock-status phase-change memory cells from among the plurality of phase-change memory cells.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

In association with an one time programmable (OTP) device contained in a semiconductor memory device capable of preventing the forgery or modification of specific information, although unlock-status information from an external device is input to an OTP register having a lock status, the semiconductor memory device according to the present invention deactivates a pulse generator for transmitting the unlock-status information such that the OTP register is prevented from being programmed.

As a result, when some areas of the OTP device contained in the semiconductor memory device of the present invention are programmed to a lock status, the locked areas of the OTP device cannot be returned to the unlock status.

Figure 1:
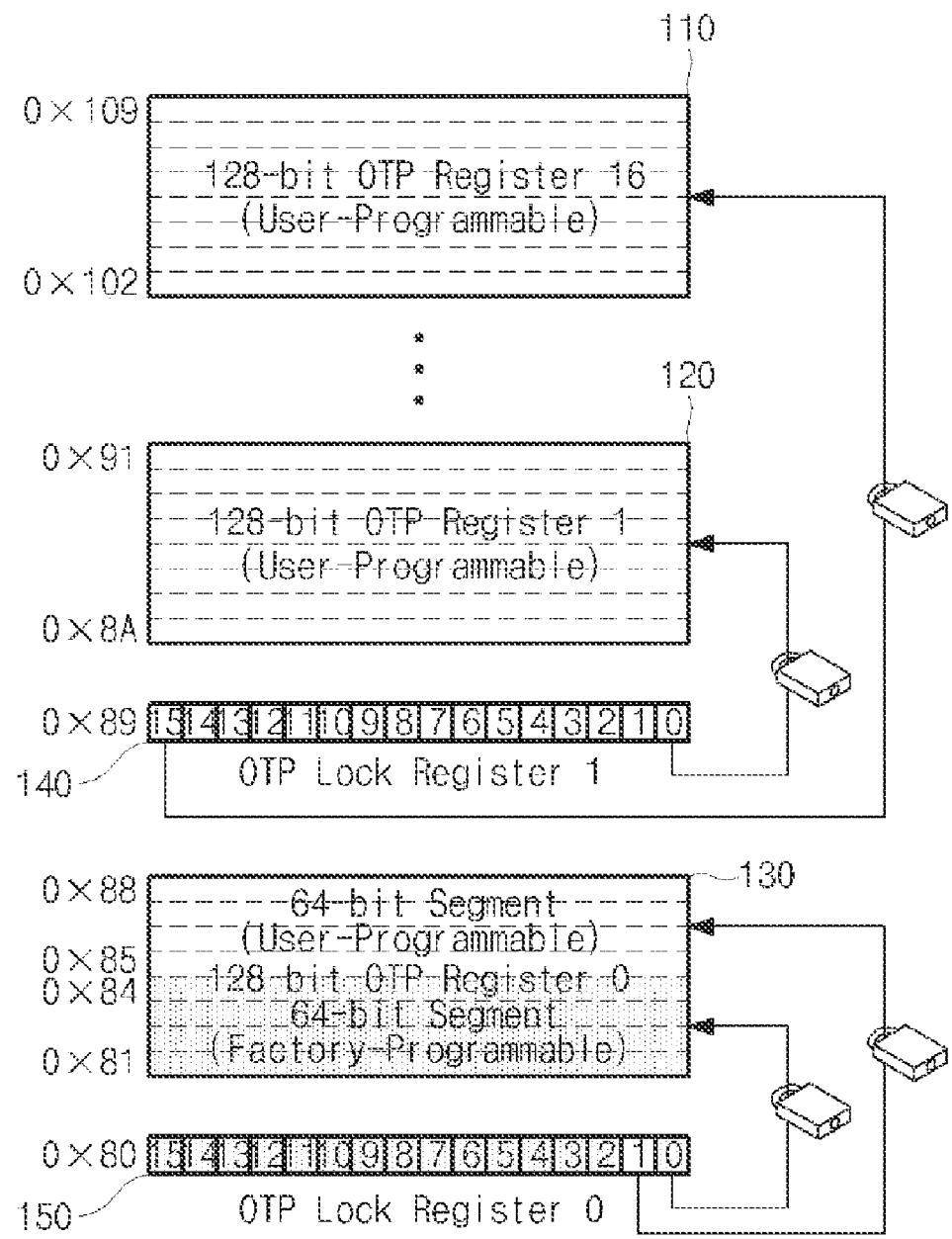
FIG. 1 is a block diagram illustrating an OTP array of a semiconductor memory device according to an embodiment of the present invention.

FIG. 1 is a block diagram illustrating a storage array, e.g., an OTP array, of a semiconductor memory device according to an embodiment of the present invention.

The semiconductor memory device according to an embodiment of the present invention may be a non-volatile memory device.

Referring to FIG. 1, the OTP array includes a plurality of OTP registers 110, 120 and 130 and a plurality of OTP lock registers 140 and 150. The OTP registers 110, 120 and 130 store information or data to be provided to a system or electronic device including the semiconductor memory device.

The OTP lock registers 140 and 150 record information indicating a lock or unlock status of the OTP registers 110, 120 and 130.

For example, lock/unlock-status information of respective areas corresponding to addresses 0x81~0x84 of the OTP register 130 is recorded in an area <0> of the OTP lock register 150. Lock/unlock-status information of respective areas corresponding to addresses 0x85~0x88 of the OTP register 130 is recorded in an area <1> of the OTP lock register 150. For another example, lock/unlock-status information of respective areas corresponding to addresses 0x8A~0x91 of the OTP register 120 is recorded in an area <0> of the OTP lock register 140. Herein, information of a specific bit of the OTP lock register 140 or 150 may store lock/unlock-status information of a data area such as a 64-bit or 128-bit area according to a system environment and the design of the semiconductor memory device.

If an OTP lock register stores unlock-status information therein, an OTP register coupled to the OTP lock register can be freely programmed. In contrast, if the OTP lock register stores lock-status information in its certain area, an OTP register coupled to a corresponding bit of the OTP lock register is prevented from being programmed.

If important data is stored in the OTP register, data stored in the OTP lock register which stores lock/unlock status information of a corresponding OTP register needs to be protected from external manipulation. In other words, if lock-status information is stored in the OTP lock register, the lock-status information should not be changed to unlock-status information.

A phase change random access memory (PRAM) changes its crystal structure using heat generated by applying a current signal to a phase change memory element, and stores data according to resistance values caused by the changed crystal structure.

Hereinafter, a security controller, e.g. an OTP controller, for preventing a lock status of a memory, which has a different program scheme according to a data type, like the PRAM, from being changed to an unlock status will be described with reference to the accompanied drawings.

Figure 2:
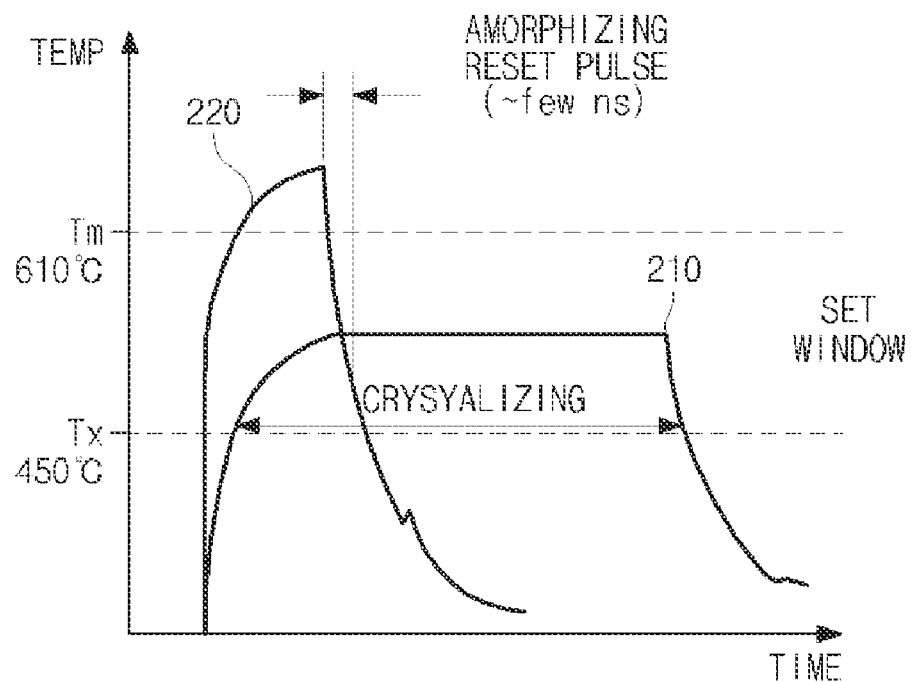
FIG. 2 is a graph illustrating operations of a memory element in a semiconductor memory device according to an embodiment of the present invention.

FIG. 2 is a graph illustrating operations of a memory element in a semiconductor memory device according to an embodiment of the present invention.

The semiconductor memory device according to this embodiment of the present invention may be a phase change memory device such as the PRAM.

Referring to FIG. 2, a crystal structure of a memory element contained in the semiconductor memory device is classified into a non-crystalline status (also called an "amorphous status") and a crystalline status, and the status of the crystal structure may be decided by heat generated when a current signal flows into the memory element. For example, when a set current 210 passes through the memory element, and thus a temperature goes up to 450° C., the memory element has the crystalline status. Otherwise, when a rest current 220 passes through the memory element, and thus the temperature goes up to 610° C., the memory element has the non-crystalline status (i.e., the amorphous status).

Figure 3:
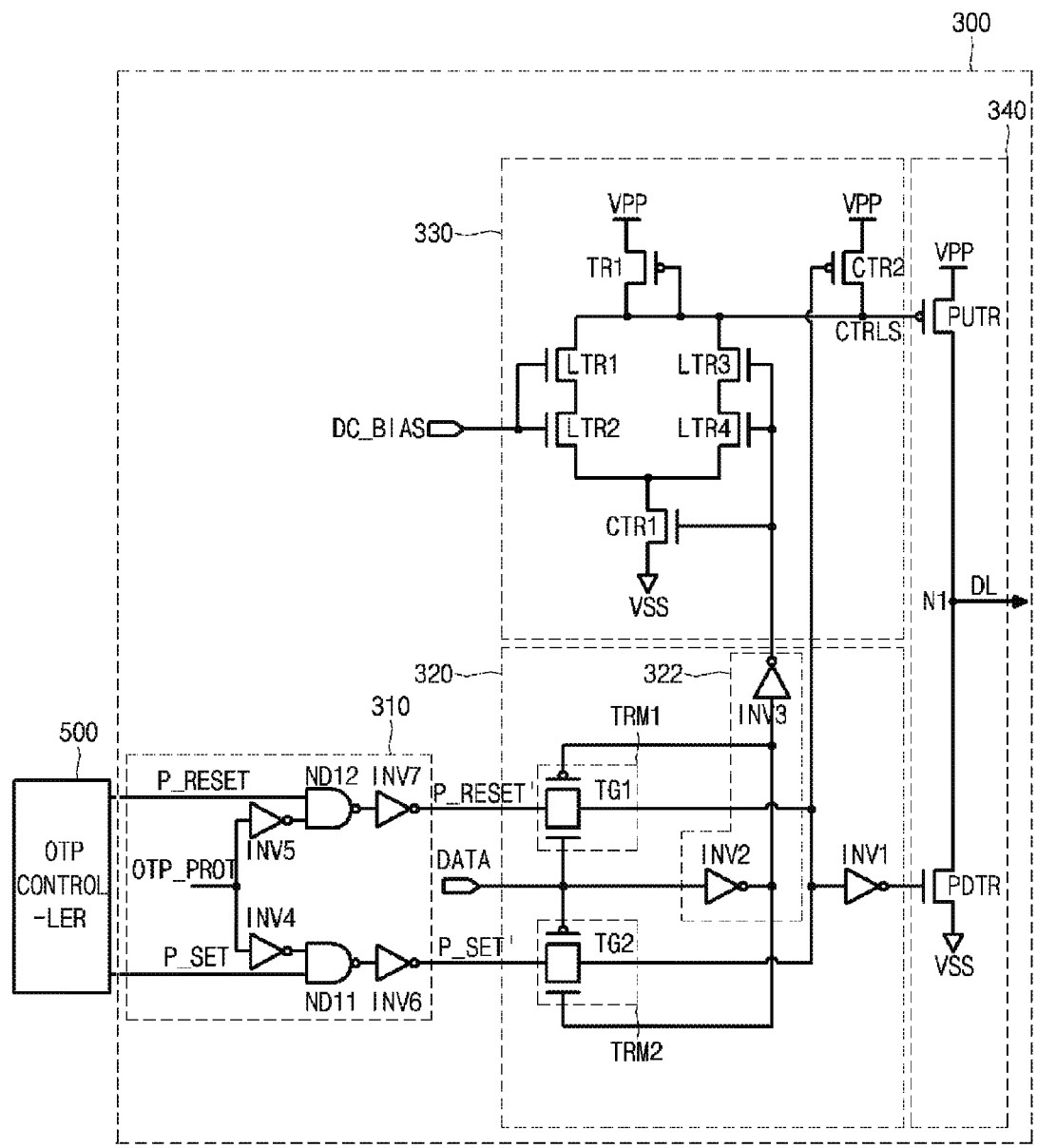
FIG. 3 is a circuit diagram illustrating a write driver in a semiconductor memory device according to an embodiment of the present invention.

FIG. 3 is a circuit diagram illustrating a write driver 300 in a semiconductor memory device according to an embodiment of the present invention.

Referring to FIG. 3, the write driver 300 includes a program current cut-off circuit 310, a pulse selection circuit 320, a current control circuit 330, and a current driving circuit 340.

The write driver 300 provides a program current to a memory cell during a program operation. In this case, the program current includes a set current for making a phase change material of the memory cell be in a crystalline status, and a reset current for making the phase change material of the memory cell be in a non-crystalline or amorphous status.

The write driver 300 receives data DATA from a data input/output (I/O) buffer (not shown) and a reset pulse P_RESET or a set pulse P_SET from an OTP controller 500.

The write driver 300 calculates the reset pulse P_RESET or the set pulse P_SET, and the data DATA to provide the reset current or the set current to a data line DL.

For example, if the data DATA is set to '0', the reset pulse P_RESET and the data '0' are calculated such that the reset current is provided to the data line DL. On the other hand, if the data DATA is set to '1', the set pulse P_SET and the data '1' are calculated to provide the set current to the data line DL.

A detailed process for generating the reset pulse P_RESET and the set pulse P_SET will be described later with reference to FIG. 5. A process for generating the reset current and the set current by driving the input data DATA, the reset pulse P_RESET and the set pulse P_SET will be described in detail hereinafter.

In addition, the write driver 300 may block the set current or the reset current from being provided to the data line DL in response to an OTP protection signal OTP_PROT. Therefore, if the OTP protection signal OTP_PROT is enabled, the phase change memory device may cut off a program operation on an OTP cell array.

The program current cut-off circuit 310 includes two NAND gates ND11 and ND12 and four inverters INV4~INV7. If a high-level OTP protection signal OTP_PROT is input thereto, the program current cut-off circuit 310 outputs low-level output signals P_RESET' and P_SET'. In this case, an NMOS transistor PDTR of the current driving circuit 340 receives a high-level signal through its gate, and thus the data line DL receives a ground voltage VSS. In this case, providing the program current to the write driver 300 is cut off. In contrast, if a low-level OTP protection signal OTP_PROT is input thereto, the program current cut-off circuit 310 outputs the reset pulse P_RESET' or the set pulse P_SET'.

The pulse selection circuit 320 includes a first transmitter TRM1, a second transmitter TRM2, a buffer unit 322, and a first inverter INV1. The first transmitter TRM1 transmits the reset pulse P_RESET' in response to the data DATA. The second transmitter TRM2 transmits the set pulse P_SET' in response to the data DATA. The first transmitter TRM1 and the second transmitter TRM2 respectively include gates TG1 and TG2 that are turned on or off in response to the data DATA.

If either the first transmitter TRM1 or the second transmitter TRM2 is turned on, the other one is turned off. The buffer unit 322 buffers the data DATA and outputs the buffered data to the current control circuit 330.

The buffer unit 322 includes a second inverter INV2 and a third inverter INV3. The second inverter INV2 outputs inverting data DATA by inverting the data DATA. The third inverter INV3 inverts the inverting data DATA, and outputs inverted data (i.e., the buffered data) to the current control circuit 330. The first inverter INV1 inverts an output signal of the first transmitter TRM1 or an output signal of the second transmitter TRM2, and outputs the inverted output signal to the current driving circuit 340.

The current control circuit 330 includes a first transistor TR1, a first level controller LTR1 and LTR2, a second level controller LTR3 and LTR4, a first control transistor CTR1, and a second control transistor CTR2.

The first control transistor CTR1 controls an operation of the current control circuit 330 in response to the buffered data. A drain terminal of the first control transistor CTR1 is commonly connected to source terminals of the second and fourth level transistors LTR2 and LTR4, a source terminal of the first control transistor CTR1 is coupled to a second voltage (VSS) input terminal, and the buffered data is applied to a gate terminal of the first control transistor CTR1.

The second control transistor CTR2 turns off the first transistor TR1 during a disable time period of the reset pulse P_RESET' or the set pulse P_SET', and outputs a control signal CTRLS at a third level. A source terminal of the second control transistor CTR2 is coupled to a first voltage (VPP) input terminal, a drain terminal of the second control transistor CTR2 is coupled to a drain terminal of the first transistor TR1, and the reset pulse P_RESET' or the set pulse P_SET' is applied to a gate terminal of the second control transistor CTR2.

The current driving circuit 340 includes a pull-up transistor PUTR and the pull-down transistor PDTR. A source terminal of the pull-up transistor PUTR is coupled to the VPP input terminal, a drain terminal of the pull-up transistor PUTR is coupled to a first node N1, and the control signal CTRLS is applied to a gate terminal of the pull-up transistor PUTR. A drain terminal of the pull-down transistor PDTR is coupled to the first node N1, a source terminal of the pull-down transistor PDTR is coupled to the VSS input terminal, and an inverted signal of the reset pulse P_RESET' or the set pulse P_SET' is applied to a gate terminal of the pull-down transistor PDTR. During an enable time period of the reset pulse P_RESET' or the set pulse P_SET', the pull-down transistor PDTR is turned off, and the pull-up transistor PUTR is turned on. The turn-on characteristics of the pull-up transistor PUTR may be controlled by a voltage level of the control signal CTRLS, such that an amount of a current applied to a phase change memory array is controlled.

As can be seen from the above description, the write driver 300 includes a function of controlling the program operation of the OTP register. In other words, if the OTP protection signal OTP_PROT has a logic high level in response to lock-status information, each of the reset pulse P_RESET' and the set pulse P_SET' is at a logic low level. In this case, the pull-down transistor PDTR and the pull-up transistor PUTR are not driven. That is, the driving of the current driving circuit 340 of the write driver 300 for writing data is prevented for an OTP register in a lock status.

Figure 4:
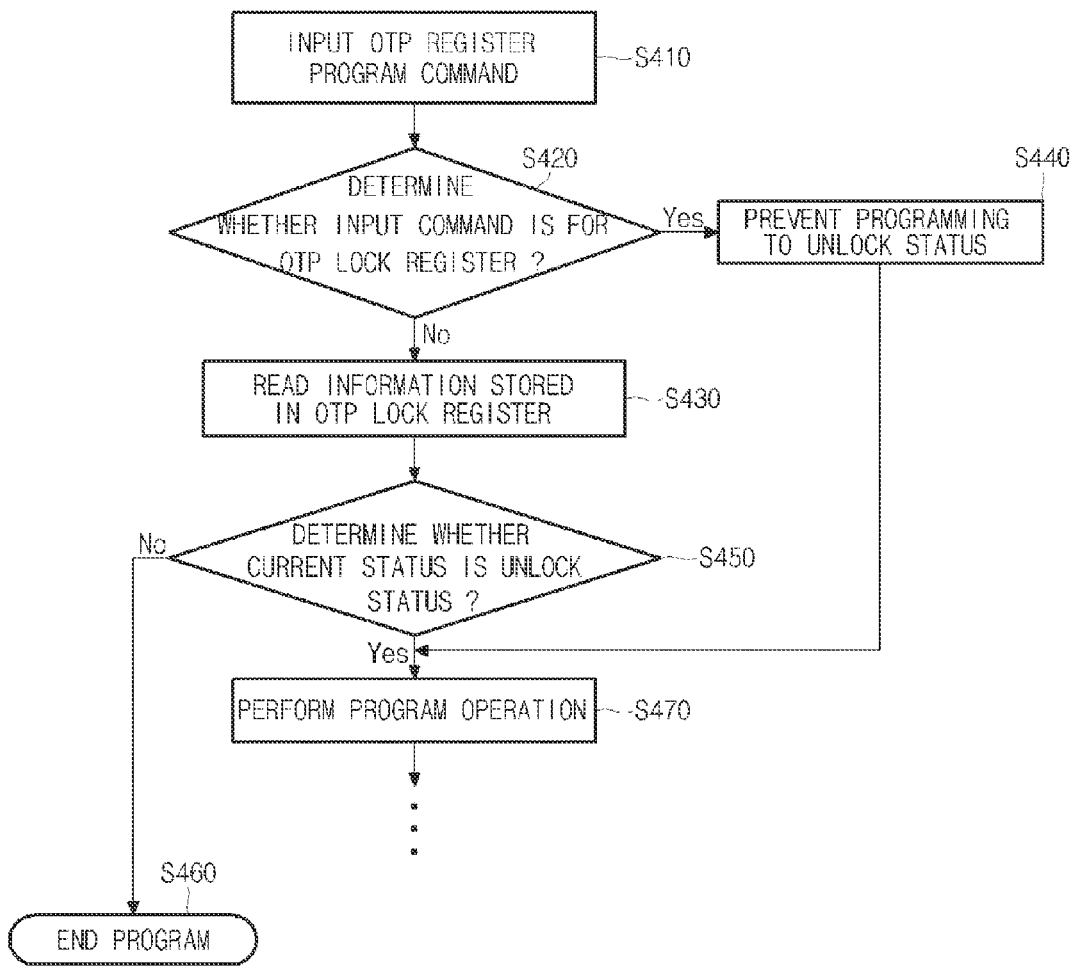
FIG. 4 is a flowchart illustrating a method for controlling an OTP device in a semiconductor memory device according to an embodiment of the present invention.

FIG. 4 is a flowchart illustrating a method for controlling an OTP device in a semiconductor memory device according to an embodiment of the present invention.

In the semiconductor memory device according to the present invention, some areas of a cell array comprised of unit cells, each of which stores data, are allocated as an OTP register. In the case of performing a program or read operation of the OTP device, a driver for writing or reading data in or from the cell array is used.

Whether or not the OTP register was programmed may be decided according to information recorded in a corresponding OTP lock register. Therefore, in accordance with the embodiments of the present invention, the unlock information is prevented from being recorded in the OTP lock register, such that the data stored in the OTP register is protected from external manipulation.

Referring to FIG. 4, if a command for programming the OTP device is input to the semiconductor memory device at step S410, it is determined whether the input command is to program the OTP lock register or the OTP register at step S420. If the corresponding command is to program the OTP lock register, data indicating the unlock status is prevented from being programmed in the OTP lock register at step S440.

If the corresponding command is to program the OTP register instead of the OTP lock register, information stored in the OTP lock register, which indicates the lock/unlock status of the OTP register, is read out at step S430. Then, it is determined whether the information stored in the OTP lock register indicates the unlock status at step S450. If the information of the OTP lock register does not indicate the unlock status, the semiconductor memory device according to the present invention stops the command operation which has been input to program the OTP device at step S460. In contrast, if the information of the OTP lock register indicates the unlock status, the semiconductor memory device performs a specific program operation on the OTP device in response to the input command at step S470.

As described above, if the command for programming the OTP device is input, the semiconductor memory device first determines whether the OTP register is to be programmed or the OTP lock register is to be programmed. If the command is for the programming of the OTP lock register, the lock-status information is prevented from changing to unlock-status information, such that it is only possible to perform the program command for changing the unlock-status information to the lock-status information. Therefore, when using the OTP lock register designed to initially store the unlock-status information, if a current status is changed to the lock status, it is impossible for the OTP lock register to return to the unlock status in a subsequent programming operation, such that the stability of data stored in the OTP register corresponding to the lock-status information recorded in the OTP lock register can be guaranteed.

Figure 5:
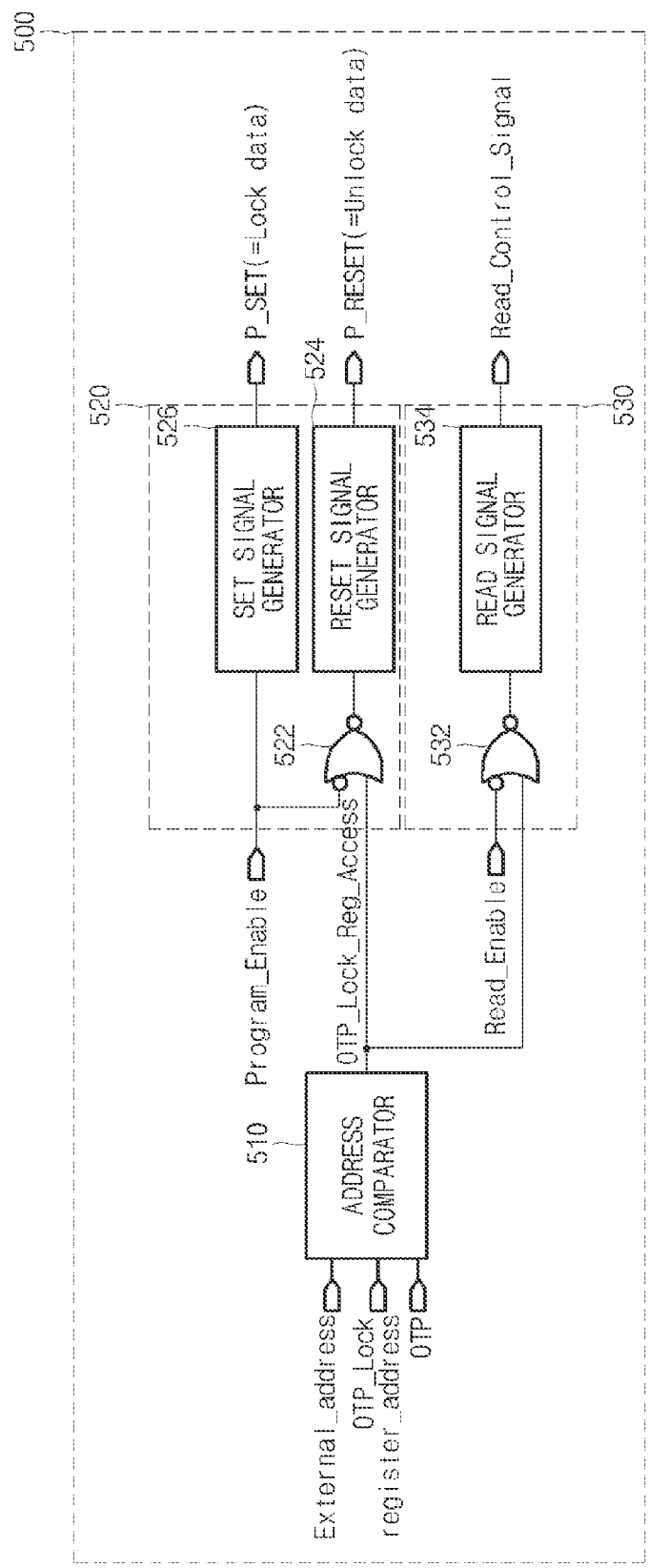
FIG. 5 is a circuit diagram illustrating an OTP controller in a semiconductor memory device according to an embodiment of the present invention.

FIG. 5 is a circuit diagram illustrating the OTP controller 500 in the semiconductor memory device according to an embodiment of the present invention.

Referring to FIG. 5, the OTP controller 500 includes an address comparator 510, a program pulse generating unit 520, and a read signal generating unit 530.

If a command related to the OTP device is input, an OTP signal OTP is enabled, and the address comparator 510 is activated in response to the enabled OTP signal OTP. The address comparator 510 activated by the OTP signal OTP compares an external input address External_address and an address OTP_Lock_register_address corresponding to the OTP lock register so as to determine whether the external input address External_address is in the range of the address OTP_Lock_register_address, and outputs a comparison signal OTP_Lock_Reg_Access.

The read signal generating unit 530 outputs a read control signal Read_Control_Signal in response to the comparison signal OTP_Lock_Reg_Access from the address comparator 510 and a read enable signal Read_Enable enabled by an OTP read command.

In more detail, the read signal generating unit 530 includes a first logic gate 532 and a read signal generator 534. The first logic gate 532 receives the read enable signal Read_Enable and the comparison signal OTP_Lock_Reg_Access. The first logic gate 532 inverts the read enable signal Read_Enable, and performs a logical NOR operation on the inverted read enable signal Read_Enable and the comparison signal OTP_Lock_Reg_Access. The first logic gate 532 outputs a logic high signal when the read enable signal Read_Enable is at a logic high level and the comparison signal OTP_Lock_Reg_Access is at a logic low level.

That is, if the external input address External_address is different from the address OTP_Lock_register_address corresponding to the OTP lock register when the read enable signal Read_Enable enabled by the OTP read command is applied to the first logic gate 532, the first logic gate 532 controls the read signal generator 534 to be activated. If an address not corresponding to the OTP lock register is input when the OTP read command is input, the read signal generator 534 outputs a pulse-shaped signal.

The program pulse generating unit 520 outputs the reset pulse P_RESET and the set pulse P_SET in response to the comparison signal OTP_Lock_Reg_Access and a program enable signal Program_Enable enabled by an OTP program command.

The program pulse generating 520 includes a second logic gate 522, a reset signal generator 524 and a set signal generator 526. The second logic gate 522 receives the comparison signal OTP_Lock_Reg_Access and the program enable signal Program_Enable. The second logic gate 522 inverts the program enable signal Program_Enable, and performs a logical NOR operation on the inverted program enable signal Program_Enable and the comparison signal OTP_Lock_Reg_Access.

Through the above-mentioned operation, the second logic gate 522 outputs a logic high signal when the program enable signal Program_Enable is at a logic high level and the comparison signal OTP_Lock_Reg_Access is at a logic low level. That is, when the external input address External_address is different from the address OTP_Lock_register_address corresponding to the OTP lock register while the program enable signal corresponding to the OTP program command is applied to the second logic gate 522, the second logic gate 522 makes the reset signal generator 524 be activated, thereby enabling the reset pulse P_RESET.

The set signal generator 526 for enabling the set pulse P_SET is activated by the program enable signal Program_Enable. If the set signal generator 526 and the reset signal generator 524 are activated, a pulse-shaped signal is output therefrom.

If a command for programming the OTP register or the OTP lock register is input thereto, the program pulse generating unit 520 enables the set pulse P_SET for changing an unlock status to a lock status irrespective of whether an address for programming corresponds to the OTP register or the OTP lock register.

However, if the programming address does not correspond to the OTP lock register, the program pulse generating unit 520 enables the reset pulse P_RESET for changing a lock status to an unlock status. That is, the program pulse generating unit 520 does not enable the reset pulse P_RESET for the OTP lock register.

The reset pulse P_RESET and the set pulse P_SET, which are output from the program pulse generating unit 520 of the OTP controller 500, are input to the write driver 300 shown in FIG. 3, such that they drive the reset current or the set current as described above.

Therefore, although the OTP controller 500 receives data indicating an unlock status from an external part, it does not transmit the data to the OTP lock register, such that lock-status information recorded in the OTP lock register can be protected. When using a non-volatile semiconductor memory device capable of supporting the OTP device in accordance with the embodiments of the present invention, it is possible to prevent information indicating the lock/unlock status of the OTP device from being changed or modified by external manipulation.

Through the above-mentioned operation, if the lock status of the OTP device is unchanged, the semiconductor memory device according to the embodiments of the present invention can safely protect important data such as security data or a boot code stored in the OTP area.

As apparent from the above description, when lock-status information is stored in the OTP lock register to represent a lock status of a certain OTP register, it is impossible to change the lock status to an unlock status, such that the OTP device contained in the semiconductor memory device can be safely protected from faulty operations caused by external manipulation and external environments such as external input or voltage. As a result, the semiconductor memory device according to the embodiments of the present invention can prevent the lock status of the OTP device from being arbitrarily changed by the external manipulation, and thus the reliability of the semiconductor memory device can be enhanced.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a storage block having a storage region configured to store data, wherein the storage region is enabled to allow data to be written therein if an unlock status is associated with the storage region and disabled to prevent data from being written therein if a lock status is associated with the storage region, when a program command is input; and
   a controller configured to prevent the lock status from being changed to the unlock status,.
   wherein the storage block includes:
      a one time programmable (OTP) register configured to store the data, the storage region being the OTP register; and
      an OTP lock register configured to store information indicating the lock/unlock status of the OTP register, and
   wherein the controller includes:
      an address comparator configured to compare an external input address with an address of the OTP lock register, and output a comparison signal;
      a program pulse generating unit configured to output a reset pulse and a set pulse in response to the comparison signal; and
      a read signal generating unit configured to output a read control signal in response to the comparison signal.

2. The semiconductor memory device according to claim 1, wherein each of the OTP register and the OTP lock register includes:
   a plurality of unit cells in a cell array.

3. The semiconductor memory device according to claim 2, further comprising:
   a write driver configured to write or program data in one or more of the unit cells.

4. The semiconductor memory device according to claim 1, wherein the program pulse generating unit is configured to disable the reset pulse when the external input address and the address of the OTP lock register correspond to each other.

5. The semiconductor memory device according to claim 1, wherein the program pulse generating unit includes:
   a reset pulse generator configured to generate the reset pulse;
   a logic gate configured to output a control signal to activate the reset pulse generator when the program command is input and the external input address is different from the address of the OTP lock register; and
   a set pulse generator configured to be activated by the program command to generate the set pulse.

6. The semiconductor memory device according to claim 1, wherein the read signal generating unit is configured to disable the read control signal when the external input address is identical to the address of the OTP lock register.

7. The semiconductor memory device according to claim 1, wherein the read signal generating unit includes:
   a read signal generator configured to generate the read control signal; and
   a logic gate configured to activate the read signal generator when a read command is input and the external input address is different from the address of the OTP lock register.

8. The semiconductor memory device according to claim 1, wherein the lock status represents a status that a specific operation for changing the data stored in the storage block is prohibited, and wherein the storage block includes one or more non-volatile memory cells.

9. A method for controlling a semiconductor memory device, the method comprising:
   providing a storage block having a storage region configured to store data, wherein the storage region is associated with a lock/unlock status;
   determining whether or not a program command that is input indicates the lock/unlock status is to be changed; and
   prohibiting a lock status from being changed to an unlock status before the determining step when the program command is input,
   wherein prohibiting the lock status from being changed to the unlock status includes:
      comparing an external input address with an address corresponding to the data in the lock status when the program command is input; and
      prohibiting the change of the lock status of the data according to a result of the comparison.

10. The method according to claim 9, further comprising:
    enabling the change to the unlock status of the data if the external input address is different from the address corresponding to the data in the lock status.

11. The method according to claim 9, wherein the determining step includes:
    confirming information indicating a lock/unlock status of a one time programmable (OTP) register corresponding to the external input address, wherein the OTP register stores the data.

12. A phase-change memory device comprising:
a register configured to include a plurality of phase-change memory cells;
a lock register configured to store information indicating a lock/unlock status of each phase-change memory cell;
a write driver configured to generate a program current for programming the plurality of phase-change memory cells; and
a controller configured to control the write driver to prevent the program current from being provided to one or more phase-change memory cells in a lock status among the plurality of phase-change memory cells.

13. The phase-change memory device according to claim 12, wherein the lock register stores addresses of the one or more phase-change memory cells in the lock status.

14. The phase-change memory device according to claim 13, wherein, in a write operation, the controller is configured to compare an address of each phase-change memory cell in the lock status with a programming address provided from an external device, and cause the write driver not to provide the program current to the phase-change memory cell in the lock status when the address of the phase-change memory cell in the lock status and the programming address provided from the external device are identical to each other.

15. The phase-change memory device according to claim 12, wherein the lock register stores addresses of one or more phase-change memory cells in an unlock status among the plurality of phase-change memory cells.

16. The phase-change memory device according to claim 13, wherein in a write operation, the controller is configured to compare an address of each phase-change memory cell in the unlock status with a programming address provided from an external device, and cause the write driver to provide the program current to the phase-change memory cell in the unlock status when the address of the phase-change memory cell in the lock status and the programming address provided from the external device are identical to each other.

17. The phase-change memory device according to claim 12, wherein the lock register includes one or more non-volatile memory cells.

18. A control method of a semiconductor memory device comprising:
verifying whether a programming command is to program an OTP lock register or an OTP register;
reading the OTP lock register when the programming command is to program the OTP register;
verifying whether information stored in the OTP lock register is in a lock status or in a unlock status; and
programming the OTP register and the OTP lock register according to the programming command,
wherein verifying whether the programming command is to program the OTP lock register or the OTP register includes:
comparing an external input address of the programming command with an address of the OTP lock register.

19. The control method according to claim 18, further comprising:
preventing a unlock status data from being programmed in the OTP lock register when the programming command is to program the OTP lock register.

20. The control method according to claim 18, wherein the OTP register and the OTP lock register are programmed when the information stored in the OTP lock register is in the unlock status.

* * * * *